United States Patent [19]
Akimoto et al.

[11] Patent Number: 6,024,502
[45] Date of Patent: Feb. 15, 2000

[54] METHOD AND APPARATUS FOR PROCESSING SUBSTRATE

[75] Inventors: Masami Akimoto, Kumamoto; Yoichi Deguchi, Machida, both of Japan

[73] Assignee: Tokyo Electron Limited, Tokyo, Japan

[21] Appl. No.: 08/959,839

[22] Filed: Oct. 29, 1997

[30] Foreign Application Priority Data

Nov. 1, 1996 [JP] Japan ..................... 8-305490
Nov. 1, 1996 [JP] Japan ..................... 8-305491

[51] Int. Cl.$^7$ .................. G03D 7/00; G03D 5/00
[52] U.S. Cl. .............. 396/579; 396/604; 396/611; 414/416; 414/935
[58] Field of Search ............... 396/579, 604, 396/611; 118/726, 52, 715; 414/416, 935, 937, 940

[56] References Cited

U.S. PATENT DOCUMENTS

| | | | |
|---|---|---|---|
| 5,505,781 | 4/1996 | Omri et al. | 118/726 |
| 5,664,254 | 9/1997 | Ohkura et al. | 396/611 |
| 5,700,127 | 12/1997 | Harada et al. | 414/416 |
| 5,763,006 | 6/1998 | Yao et al. | 427/248.1 |

FOREIGN PATENT DOCUMENTS 4-85812  3/1992  Japan .

Primary Examiner—D. Rutledge
Attorney, Agent, or Firm—Oblon, Spivak, McClelland, Maier & Neustadt, P.C.

[57] ABSTRACT

Disclosed is an apparatus for processing a substrate in which a processing consisting of a plurality of process steps is applied to a substrate to be processed. The apparatus comprises a transfer zone extending in a vertical direction, a plurality of process groups arranged to surround the transfer zone for processing the substrate, each process group consisting of a plurality of process units stacked one upon the other, and each process unit having an opening communicating with the transfer zone for transferring the substrate into and out of the process unit, a main arm mechanism movably mounted in the transfer zone for transferring the substrate into and out of the process unit through the opening, and down flow forming means for forming a down flow of a clean air within the transfer zone. At least one of the plural process groups includes a plurality of thermal units for heating or cooling the substrate, a transfer unit for transferring the substrate into and out of the transfer zone, and a gas process unit for processing the substrate with a gas, the opening of the gas process unit being positioned lower than the openings of the thermal units and the transfer unit.

20 Claims, 8 Drawing Sheets

METHOD AND APPARATUS FOR PROCESSING SUBSTRATE

BACKGROUND OF THE INVENTION

The present invention relates to a method and apparatus for processing a substrate such as a semiconductor wafer or a substrate of a liquid crystal display (LCD) device, particularly, to a method and apparatus for processing a substrate, which includes an adhesion treatment for bringing a substrate surface into contact with a gas for modifying the substrate surface.

Employed in a photolithography process is a resist processing system in which semiconductor wafers are successively coated with a resist solution, followed by developing the resist coating. Such a resist processing system is disclosed in, for example, U.S. patent application Ser. No. 08/667,712, now U.S. Pat No. 5,700,127. It is disclosed that many processing units are arranged on both sides of a horizontal transfer path, and a wafer is transferred by a main arm mechanism along the horizontal transfer path into each of these processing units. In the resist processing system of the horizontal transfer type, however, the system is expanded in a horizontal direction with increase in the number of processing units arranged along the horizontal transfer path, leading to an increased total floor area. Naturally, the resist processing system occupies a large floor area within a clean room, leading to a high manufacturing cost and operating cost of the clean room. Particularly, since a down flow of a clean air is employed in the system as a measure against particles, the initial cost and maintenance cost of the air conditioner, filter, etc. are increased if the cleanliness within the system is to be improved.

Another resist processing system is disclosed in, for example, U.S. Pat. No. 5,664,254 and Japanese Patent Disclosure (Kokai) No. 4-85812. It is disclosed that many processing units are arranged on both sides of a vertical transfer path, and a wafer is transferred by a main arm mechanism along the vertical transfer path into each of these processing units. The resist processing system of the vertical transfer type certainly permits diminishing the floor area of the system occupied in a clean room, making it possible to lower the manufacturing cost and operating cost of the clean room. Also, since the main arm mechanism can obtain access to the processing units promptly and can transfer the wafer at a higher speed, the through-put is increased. In the resist processing system of the vertical transfer type, however, a plurality of processing units are stacked one upon the other. In addition, a heating unit, a cooling unit, a transfer unit, an adhesion unit, etc. included in the system are of open type. It follows that these processing units mutually affect each other, resulting in failure for each processing unit to perform its function appropriately. Particularly, in the case of using a hexamethyldisilazane (HMDS) gas as in an adhesion processing, the HMDS gas leaking from the adhesion processing unit tends to enter another processing unit so as to adversely affect the processing in said processing unit.

In the conventional adhesion processing, a silicon wafer is introduced into a process chamber, followed by exhausting the process chamber and subsequently introducing an HMDS gas into the process chamber so as to bring the HMDS gas component into contact with the silicon wafer surface for modifying the wafer surface. After completion of the processing, the HMDS gas is forcedly discharged from within the process chamber so as to prevent the HMDS gas from leaking to the outside of the process chamber. At the same time, a purging gas such as a nitrogen gas is introduced into the process chamber so as to purge the supply piping and process chamber. In the adhesion processing of this type, however, a purging gas is supplied at a relatively high flow rate, with the result that particles tend to be generated so as to be attached to the wafer dependent on the manner of supplying the purging gas. Also, the members in the vicinity of the wafer table disturb the HMDS gas stream within the process chamber so as to prevent the HMDS gas component from being brought into contact uniformly with the surface of the wafer. It follows that the processing is rendered nonuniform, giving rise to a possibility that the wafer surface is not modified sufficiently in some regions.

BRIEF SUMMARY OF THE INVENTION

An object of the present invention is to provide an apparatus for processing a substrate, in which an atmosphere for processing a substrate with a gas such as an adhesion processing atmosphere does not adversely affect another processing atmosphere as in a resist coating process or a developing process.

Another object is to provide a method and apparatus for processing a substrate, which permit processing the substrate surface uniformly with a gas while preventing particles from being attached to the substrate surface.

In the adhesion processing, a silicon wafer is heated, and an HMDS (hexamethyldisilazane) gas is brought into contact with the surface of the heated wafer so as to convert the hydrophilic wafer surface into a hydrophobic wafer surface. To be more specific, the HMDS gas serves to chemically separate the bonding of the OH group present between the silicon wafer surface and a silicon oxide film formed on the wafer surface so as to remove water from the wafer surface.

According to a first aspect of the present invention, there is provided an apparatus for processing a substrate in which a processing consisting of a plurality of process steps is applied to a substrate to be processed, comprising a transfer zone extending in a vertical direction; a plurality of process groups arranged to surround the transfer zone for processing the substrate, each process group consisting of a plurality of process units stacked one upon the other, and each process unit having an opening communicating with the transfer zone for transferring the substrate into and out of the process unit; a main arm mechanism movably mounted in the transfer zone for transferring the substrate into and out of the process unit through the opening; and down flow forming means for forming a down flow of a clean air within the transfer zone, wherein at least one of the plural process groups includes a plurality of thermal units for heating or cooling the substrate, a transfer unit for transferring the substrate into and out of the transfer zone, and a gas process unit for processing the substrate with a gas, the opening of the gas process unit being positioned lower than the openings of the thermal units and the transfer unit.

In the substrate processing apparatus of the present invention, a down flow of clean air is formed within the transfer zone. Also, the apparatus comprises a process group consisting of a plurality of process units vertically stacked one upon the other and including a plurality of thermal units for heating or cooling the substrate, a gas processing unit, and a transfer unit for transferring the substrate into and out of the process unit. It should be noted that the gas processing unit is arranged below the thermal units and the transfer unit. As a result, the gas leaking from the gas processing unit flows downward together with the down flow of the clean air. It follows that the thermal units and the transfer unit positioned above the gas processing unit are not affected by the gas leaking from the gas processing unit.

It should also be noted that the thermal units consist of heating units and cooling units positioned below the heating units. In addition, the transfer unit is positioned below the cooling unit. It follows that it is possible to suppress a thermal interference among the process units forming the process group.

According to a second aspect of the present invention, there is provided an apparatus for processing a substrate in which a substrate to be processed is coated with resist, followed by subjecting a resultant resist coating to a developing treatment, comprising a transfer zone extending in a vertical direction; a first process group arranged in the vicinity of the transfer zone and including a resist coating unit and a developing unit stacked one upon the other, each of the resist coating unit and the developing unit having an opening through which the substrate is transferred, and the opening communicating with the transfer zone; another process group arranged in the vicinity of the transfer zone and including a heating unit, a cooling unit, a transfer unit and an adhesion unit, each of the units having an opening through which the substrate is transferred, and the opening communicating with the transfer zone; a main arm mechanism movable within the transfer zone for transferring the substrate into and out of each process unit through the opening; and down flow forming means for forming a down flow of a clean air within the transfer zone, wherein the adhesion unit, transfer unit, cooling unit, and heating unit included in the another process group are stacked in the order mentioned such that the adhesion unit occupies the lowermost position.

In the apparatus of the second aspect, a down flow of air is formed within the transfer zone. Also, the adhesion unit occupies the lowermost position in the process units included in the another process group and communicating with the transfer zone via openings thereof. It follows that the gas leaking from the adhesion unit flows further downward together with the down flow of the air within the transfer zone, making it possible to prevent the other process units from being affected by the leaking gas. Also, since the adhesion unit, transfer unit, cooling unit, and heating unit included in the another process group are stacked in the order mentioned such that the adhesion unit occupies the lowermost position, it is possible to suppress a thermal interference among these process units.

What should also be noted is that the down flow forming means includes a gas inlet port formed in an upper end of the transfer zone, an exhaust port formed in a lower end of the transfer zone, and a filter mechanism mounted in the gas inlet port for cleansing the introduced air. The particular construction makes it possible to keep a down flow of clean air formed within the transfer zone. It follows that a very clean processing can be performed in the apparatus of the present invention.

According to a third aspect of the present invention, there is provided a method for processing a substrate, comprising the steps of:

(a) transferring a substrate into a hermetic process chamber;

(b) introducing a process gas through a first fluid passageway into the process chamber to permit the process gas to be blown against a central portion of the substrate while evacuating the process chamber through an exhaust passageway to permit the introduced process gas to flow upward at a peripheral portion of the substrate, thereby to bring the process gas into contact with the entire region of a surface of the substrate for modifying the substrate surface; and (c) introducing a substituting gas through a second fluid passageway to permit the substituting gas to be blown against a region somewhat deviant from the center of the substrate while evacuating the process chamber through the exhaust passageway, thereby to expel the process gas from within the process chamber and substitute therefor the substituting gas within the process chamber.

According to a fourth aspect of the present invention, there is provided an apparatus for processing a substrate, comprising a process chamber; a substrate supporting mechanism for supporting a substrate substantially horizontal within the process chamber; a first gas supply system for supplying substantially vertically a process gas onto the substrate within the process chamber; a second gas supply system for obliquely supplying a substituting gas onto the substrate within the process chamber; and an exhaust mechanism for evacuating the process chamber.

Further, according to a fifth aspect of the present invention, there is provided an apparatus for processing a substrate, comprising a process chamber; a substrate supporting mechanism for supporting a substrate substantially horizontal within the process chamber; a first gas supply system for supplying substantially vertically a process gas onto the substrate within the process chamber; a second gas supply system for obliquely supplying a substituting gas onto the substrate within the process chamber; and an exhaust mechanism for evacuating the process chamber, wherein the substrate supporting mechanism includes a base plate and a plurality of positioning members mounted to a peripheral portion of the base plate in a manner to project upward above the substrate so as to be brought into contact with a peripheral portion of the substrate and to define the position of the substrate, and wherein the exhaust mechanism includes an exhaust port positioned above the substrate supported by the substrate supporting mechanism.

In the present invention, a process gas and a substituting gas (purge gas) are supplied to the process chamber through different fluid passageways, making it possible to form the passageway of the substituting gas not to adversely affect the substrate. Also, since the process gas can be supplied to a central portion of the substrate in a direction substantially perpendicular to the substrate surface, the process gas can be supplied uniformly from the central portion toward the peripheral portion of the substrate so as to achieve a uniform processing of the substrate with the gas. On the other hand, the substituting gas is obliquely supplied to the substrate surface, making it possible to suppress the impact given by the substituting gas to the substrate surface. Also, particles are prevented from being attached to the substrate surface.

It should also be noted that the gas is discharged from within the process chamber through an exhaust port positioned above the substrate housed in the process chamber. As a result, the gas discharge is not obstructed by the supporting mechanism of the substrate, making it possible to perform a more uniform processing.

Further, in the substrate processing apparatus of the present invention, the substrate supporting mechanism includes a plurality of positioning members projecting upward around the substrate so as to define the position of the substrate. Also, the exhaust mechanism includes an exhaust port positioned above the substrate supported by the substrate supporting mechanism. As a result, the discharge of the gas from within the process chamber is not obstructed by the positioning members and can be performed through the exhaust port. It follows that the process gas can be supplied uniformly so as to achieve a uniform processing of the substrate with a gas.

The substrate supporting mechanism further includes a spacer for forming a free space between the base plate and the substrate, making it possible to prevent particles effectively from being attached to the back surface of the substrate.

Additional objects and advantages of the invention will be set forth in the description which follows, and in part will be obvious from the description, or may be learned by practice of the invention. The objects and advantages of the invention may be realized and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

Figure 1:
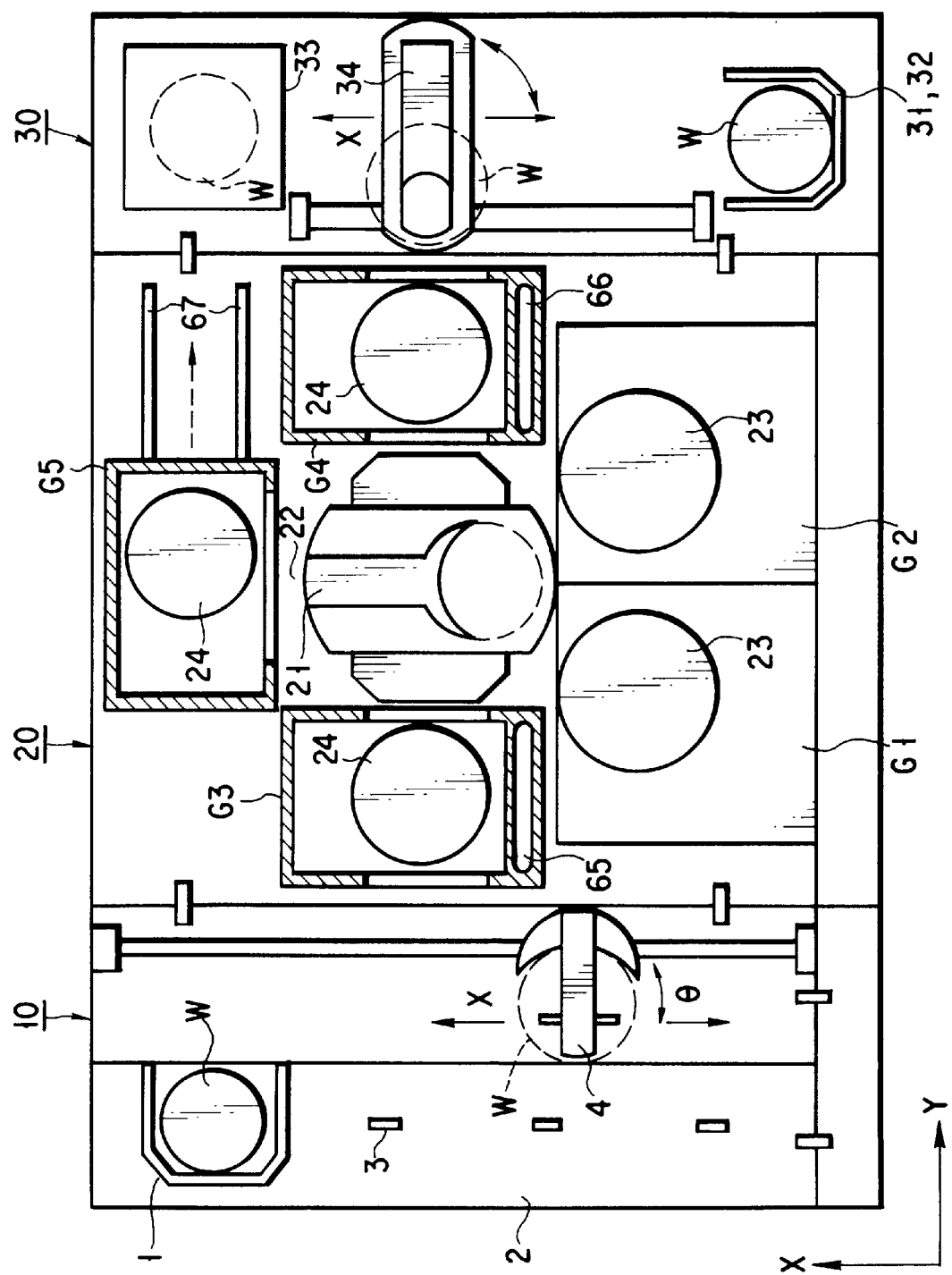
FIG. 1 is a plan view schematically showing a resist processing system.

Let us describe preferred embodiments of the present invention with reference to the accompanying drawings. Specifically, the processing system of the present invention comprises a cassette station 10, a process station 20 including a plurality of process units, and an interface section 30 for delivering and receiving a wafer W to and from an exposure device (not shown) arranged adjacent to the process station 20.

The cassette station 10 receives cassettes 1 each housing 25 silicon wafers W as an object to be processed, said cassettes 1 being transferred from another system (not shown), and transfers the processed wafers W, which are housed in the cassettes 1, to said another system.

As shown in FIG. 1, four projections 3 are formed on a cassette table 2 within the cassette station 10 such that these projections 3 are aligned in a direction of an X-axis. The cassettes 1 are arranged to surround the projections 3 such that the opening of each cassette 1 for transferring the wafer W faces the process station 20. The wafers W are held horizontal within the cassette 1 disposed on the cassette table 2.

The cassette station 10 comprises a sub-arm mechanism 4 having a holder 4a for transferring the wafer W to and from the cassette 1. The sub-arm mechanism 4, which is arranged between the cassette table 2 and the process station 20, includes an X-axis driving mechanism (not shown), a Z-axis driving mechanism (not shown), and a swinging mechanism (not shown). Therefore, the holder 4a of the sub-arm mechanism 4 is movable in an X-axis direction and Z-axis direction and swingable about the Z-axis by an angle θ. The wafer W taken out of the cassette 1 by the sub-arm mechanism 4 is transferred by the sub-arm mechanism 4 into a transfer unit (TR) 46 belonging to a process group G3, shown in each of FIGS. 3 and 5, of the process station 20.

Figure 3:
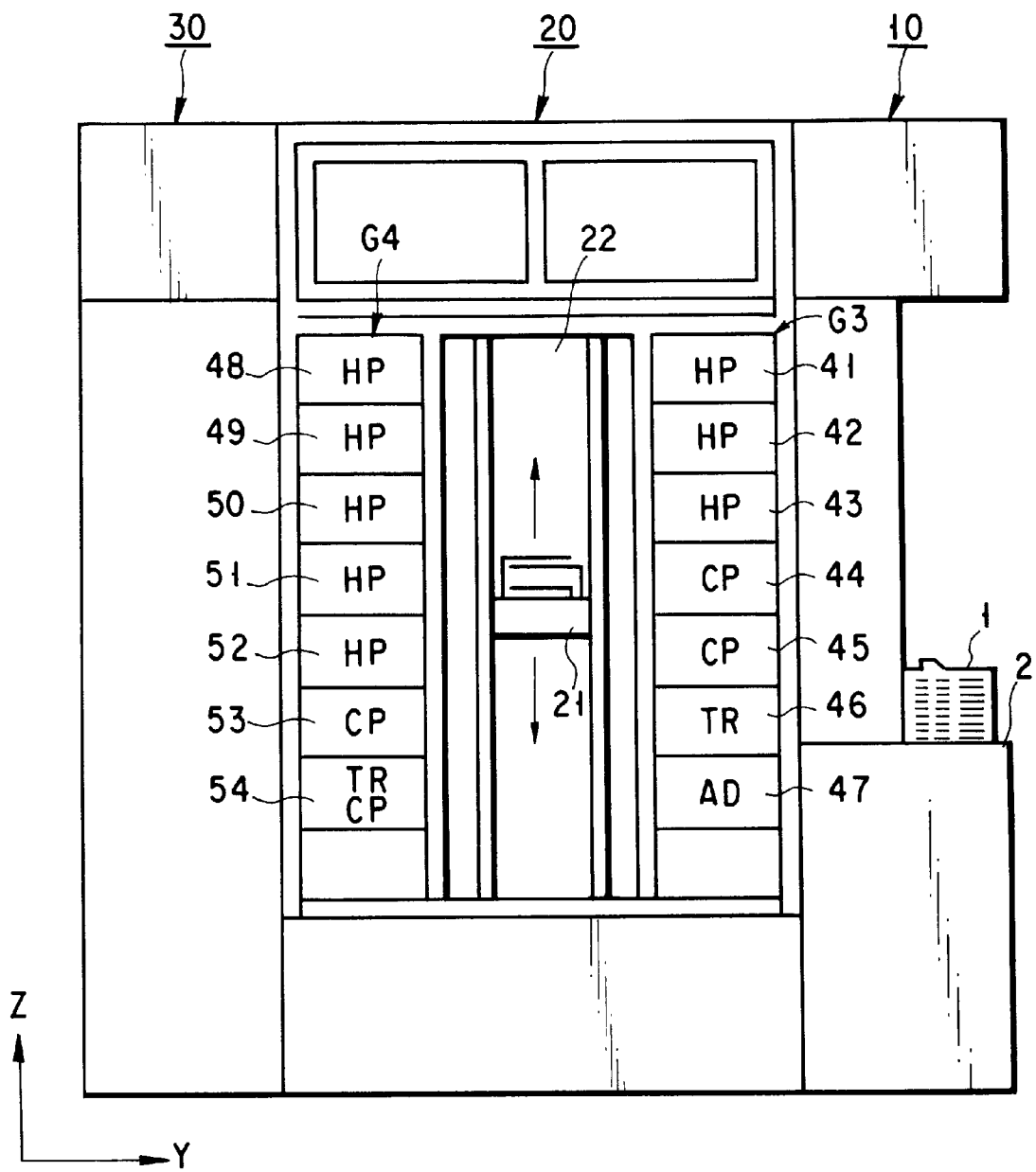
FIG. 3 is a side view schematically showing a resist processing system.
Figure 5:
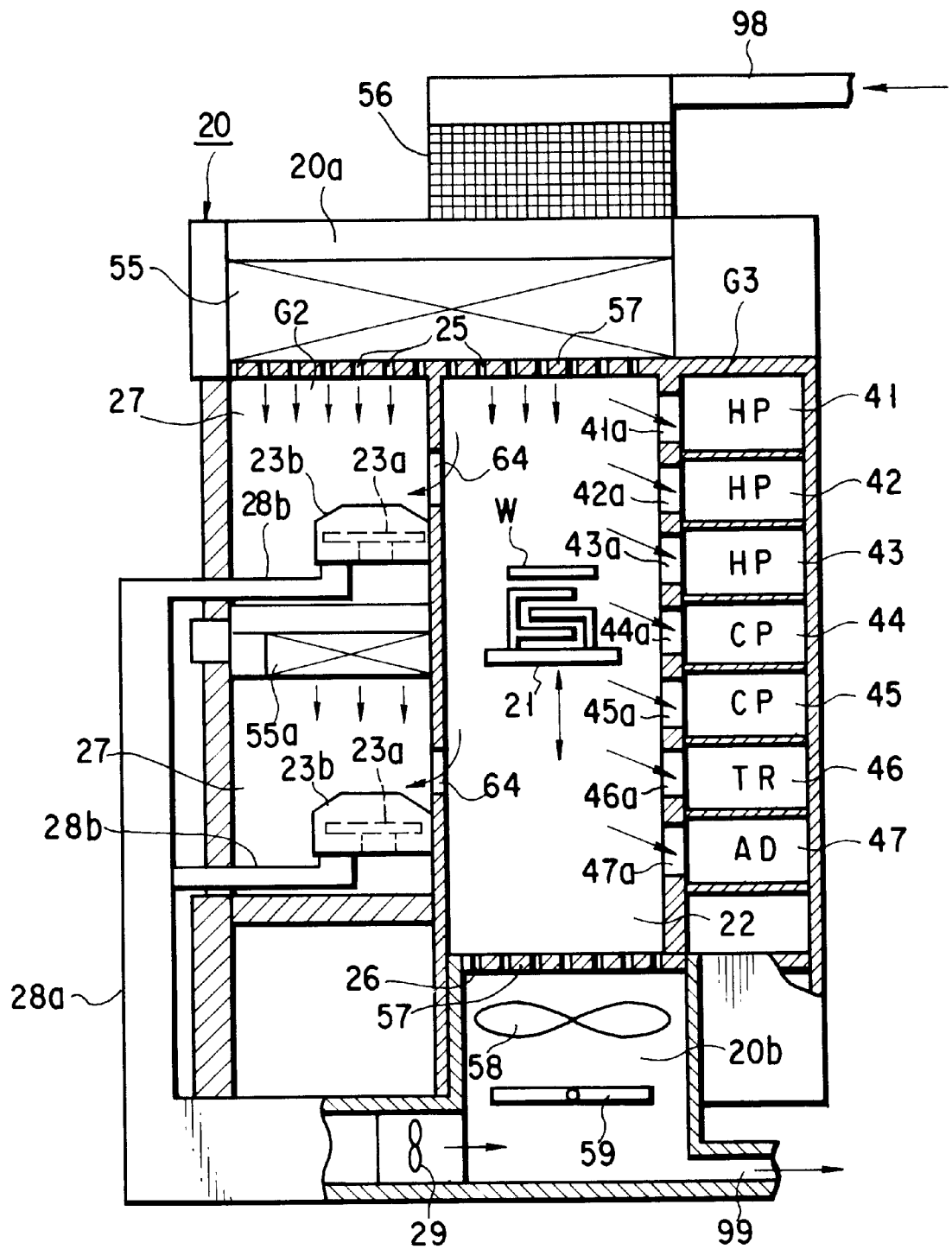
FIG. 5 schematically shows the flow of a clean air within a resist processing system.

A plurality of process units for processing the wafer W with resist are included in the process station 20. These process units are divided into 5 process groups G1, G2, G3, G4, G5. In each of these process groups, a plurality of process units are stacked one upon the other. As shown in FIGS. 3 and 5, a transfer zone 22 extending in a Z-axis direction is formed in a central portion of the process station 20. A main arm mechanism 21 is arranged in the transfer zone 22 to transfer the wafer W to each process unit.

The process groups G1 to G5 are positioned to surround the transfer zone 22. Specifically, the first and second process groups G1 and G2 are arranged side by side in a front portion of the process station 20. The third process group G3 is arranged adjacent to the cassette station 10. The fourth process group G4 is arranged adjacent to the interface section 20. Further, the fifth process group G5 is arranged in a rear portion of the process station 20.

Figure 2:
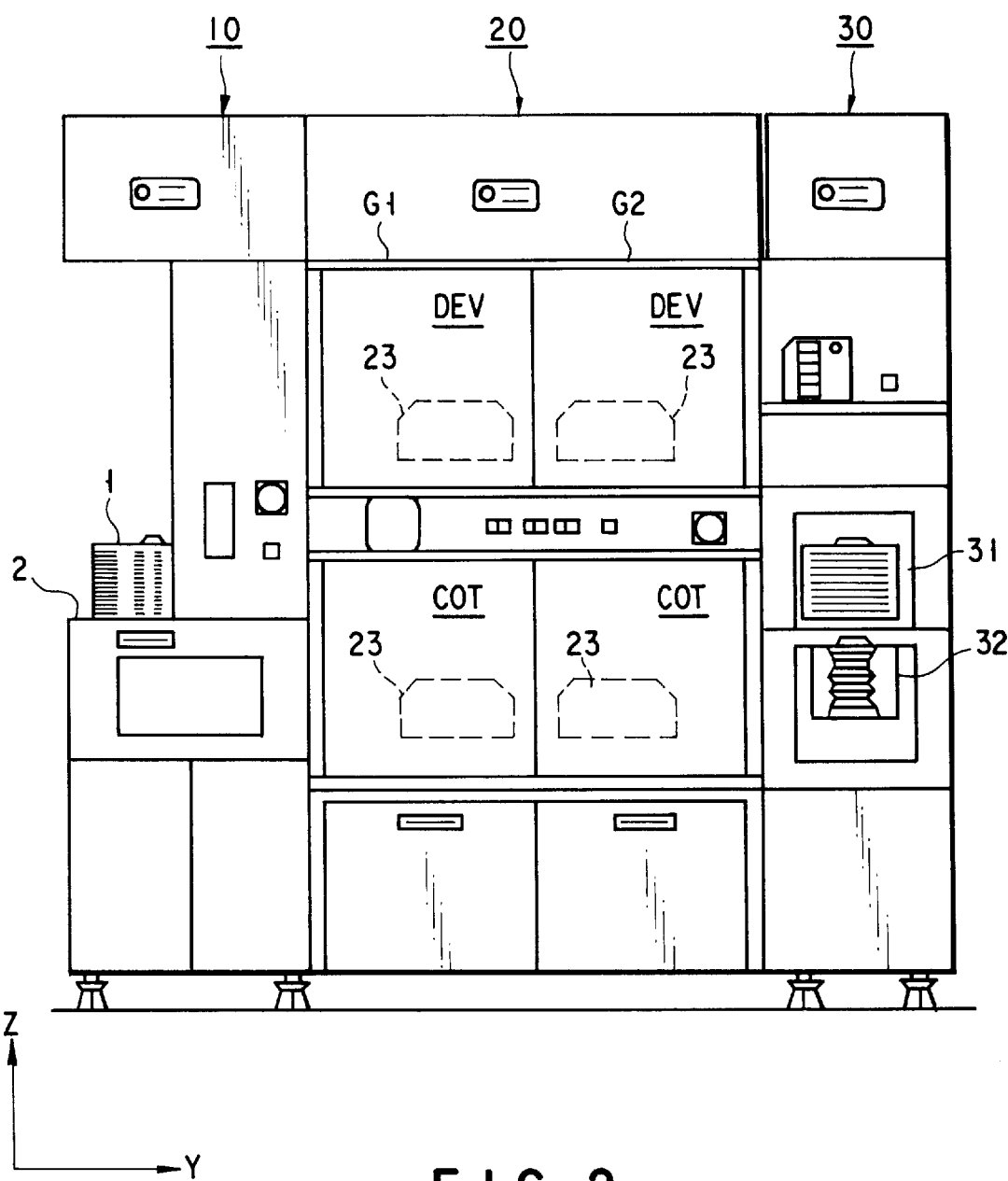
FIG. 2 is a side view schematically showing a resist processing system.

As shown in FIG. 2, two spinner type process units, i.e., a resist coating unit (COT) and a developing unit (DEV), are arranged in the first process group G1. In the embodiment shown in the drawing, these resist coating unit (COT) and developing unit (DEV) are stacked one upon the other in this order. As shown in FIG. 5, a spin chuck 23a surrounded by a cup 23b is arranged within each spinner type process unit.

Two spinner type process units, i.e., a resist coating unit (COT) and a developing unit (DEV), are also stacked one upon the other in the second process group G2 as in the first process group G1. In each of these process groups G1 and G2, the resist coating unit (COT) is positioned below the developing unit (DEV). It should be noted in this connection that the waste liquid discharged from the resist coating unit (COT) is more complex in its components and, thus, more difficult to handle than the waste liquid discharged from the developing unit (DEV). Therefore, it is necessary to make the drain line of the waste liquid discharged from the resist coating unit (COT) as short as possible and, thus, the resist coating unit (COT) is positioned below the developing unit (DEV). However, the resist coating unit (COT) may be positioned above the developing unit (DEV), as required.

As shown in FIGS. 3 and 5, seven oven type process units 41 to 47 are stacked one upon the other in the third process group G3. To be more specific, arranged in the third process group G3 are an adhesion unit (AD) 47, a transfer unit (TR) 46, two chilling plate units (CP) 44, 45, and three hot plate units (HP) 41, 42, 43. These process units 47 to 41 are stacked one upon the other in the order mentioned. As shown in FIG. 1, a plate-like wafer table 24 is mounted in each process unit included in the third process group G3such that the wafer W disposed on the wafer table 24 is heated, cooled, or subjected to an adhesion processing.

A heat treatment such as a pre-baking or post-baking is applied to the wafer W in these hot plate units (HP) 41, 42, 43. On the other hand, the wafer W is cooled in these chilling plate units (CP) 44, 45. Further, the transfer unit (TR) 46 is for transfer of the wafer W between the cassette station 10 and the process station 20. Still further, an adhesion processing using an HMDS gas for making the surface of the wafer W hydrophobic is carried out in the adhesion unit (AD) 47.

As shown in FIG. 3, seven oven type process units 48 to 54 are also stacked one upon the other in the fourth process group G4 as in the third process group G3. To be more specific, arranged in the fourth process group G4 are a transferring-chilling plate unit (TR-CP) 54, a chilling plate unit (CP) 53, and five hot plate units (HP) 52, 51, 50, 49, 48. These process units 54 to 48 are stacked one upon the other in the order mentioned. As shown in FIG. 1, a plate-like wafer table 24 is also mounted in each process unit included in the fourth process group G4 such that the wafer W disposed on the wafer table 24 is heated or cooled.

Seven oven type process units are also stacked one upon the other in the fifth process group G5 as in the third and fourth process groups G3 and G4. The fifth process group G5 is movable along a guide rail 67 in a Y-axis direction. Since a free space can be formed behind the main arm mechanism 21 by sliding the fifth process group G5 in the Y-axis direction, a maintenance operation can be applied easily to the main arm mechanism 21 from behind the mechanism 21.

The interface section 30 is equal in length in the X-axis direction to the process station 20. As shown in FIGS. 1 and 2, a stationary buffer cassette 32 and a flexible pick-up cassette 31 are stacked one upon the other in this order in a front portion of the interface section 30. On the other hand, a peripheral light-exposure device 33 is arranged in a rear portion of the interface section 30. Further, a second sub-arm mechanism 34 having a holder 34a is mounted in a central portion of the interface section 30. The second sub-arm mechanism 34 is movable both in an X-axis direction and in a Z-axis direction so as to transfer the wafer W into the cassettes 31, 32 and the peripheral light-exposure device 33. Further, the second sub-arm mechanism 34 is swingable about the Z-axis by an angle θ so as to transfer the wafer W into the transfer-chilling plate unit (TR-CP) 54 included in the fourth process group G4 and onto a wafer relaying plate (not shown) on the side of the light-exposure device.

Incidentally, the resist processing system is arranged within an air-conditioned clean room. In addition, a down flow of clean air is effectively supplied within the system so as to further improve the cleanliness in each part of the system.

Figure 4:
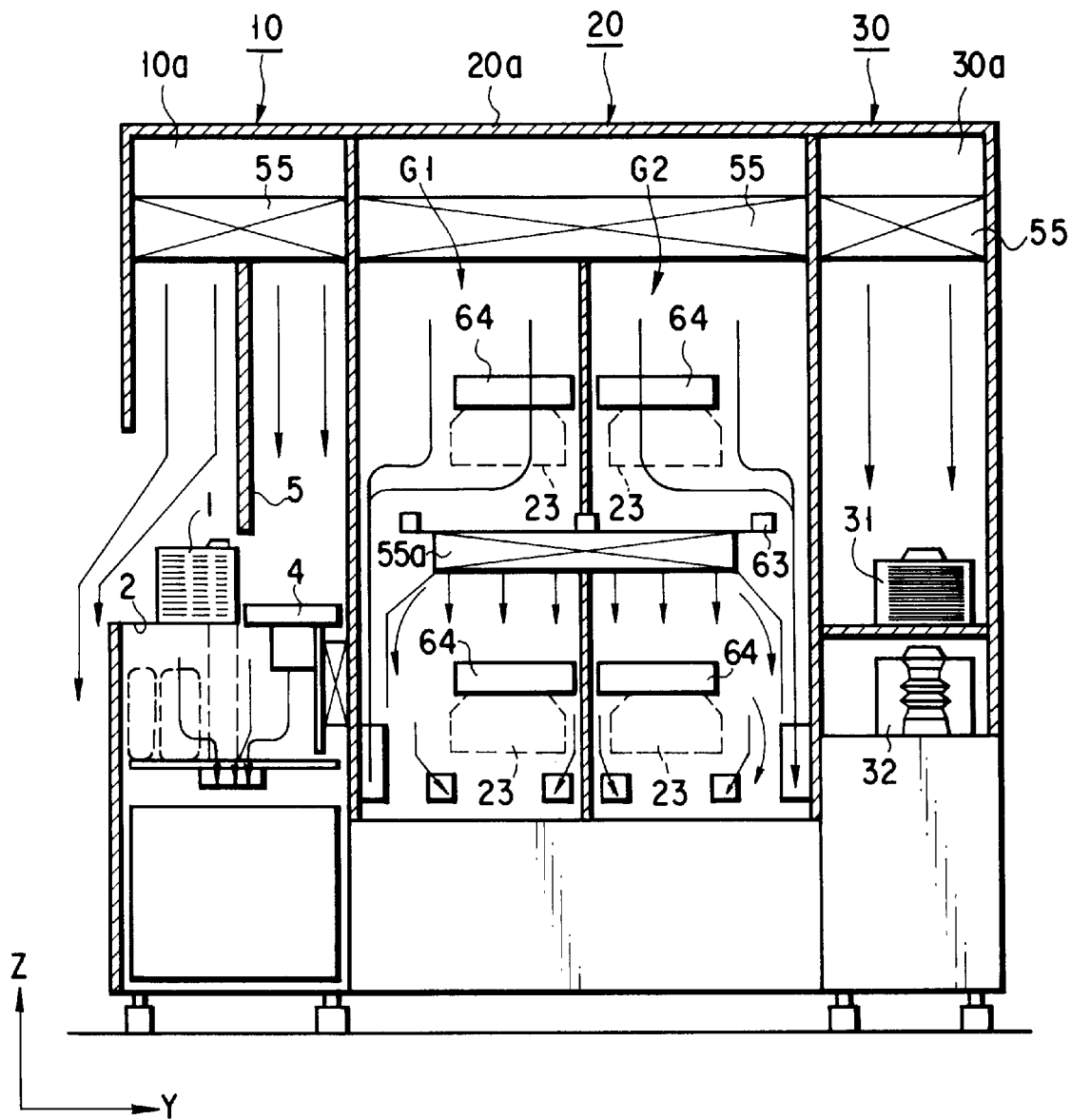
FIG. 4 schematically shows the flow of a clean air within a resist processing system.

FIGS. 4 and 5 schematically show the flow of clean air within the resist processing system. As shown in FIG. 4, air supply chambers 10a, 20a, 30a are formed above the cassette station 10, the process station 20 and the interface section 30, respectively. A filter effective removing dust, e.g., a ULPA filter 55, is mounted to extend below the air supply chambers 10a, 20a, 30a. Air is introduced through pipes (not shown) into the air supply chambers 10a and 30a. Then, a clean air passing through the ULPA filter 55 is supplied as a down flow into the cassette station 10 and the interface section 30.

As shown in FIG. 5, a porous plate 57 having air supply ports 25 formed therethrough is used as the ceiling plate of the transfer zone 22 of the main arm mechanism 21. Also, another porous plate 57 having air discharge ports 26 formed therethrough is used as the bottom plate of the transfer zone 22. The air supply chamber 20a communicates with both the air supply ports 25 and an air supply pipe 98. As described previously, the ULPA filter 55 is mounted below the air supply chamber 20a. On the other hand, a chemical filter 56 for removing organic substances such as amines is mounted above the air supply chamber 20a.

An exhaust chamber 20b is formed below the transfer zone 22 of the main arm mechanism 21 in a manner to communicate with both the air discharge ports 26 and an overall air discharge pipe 99 for collectively discharging the waste air from within the entire system. An exhaust fan 58 is arranged within the exhaust chamber 20b. Further, a pressure adjusting means such as a slit damper 59 is mounted between the exhaust chamber 20b and the air discharge pipe 99. During the process of supplying air from an air supply device (not shown) into the process station 20 through the pipe 98, the air is cleansed by the filters 56 and 55. Then, the clean air flows downward within the transfer zone 22 from the air supply ports 25 toward the air discharge ports 26.

As shown in FIG. 4, a free space above the cassette table 2 within the cassette station 10 is partitioned from a moving space of the sub-arm mechanism 4 by a vertical partition plate 5.

As shown in FIGS. 4 and 5, a ULPA filter 55a is mounted in the ceiling plate of the resist coating unit (COT) arranged in the lower portion of each of the process groups G1 and G2 included in the process station 20. The air supplied from the air supply chamber 20a flows through the ULPA filter 55a and, then, into a process space 27 of the resist coating unit (COT) to form a down flow.

An opening 64 is formed in the side wall, which faces the transfer zone 22, of each of the spinner type process units (COT) and (DEV). The wafer W and an arm holder 21a are transferred into and out of each of these process units through the opening 64. A shutter (not shown) is mounted to each of these openings 64.

As shown in FIG. 5, openings 41a to 47a are formed in the process units 41 to 47, respectively, included in the third process group G3. The wafer W and the holder arm 21a are transferred into and out of these process units 41 to 47 through these openings 41a to 47a. Incidentally, the opening 47a of the adhesion unit 47 is positioned lower than the openings 64 of the spinner type process units (COT) and (DEV). Also, a shutter (not shown) is mounted to the opening 47a of the adhesion unit 47. Further, the cup 23b of the spinner type process unit (COT) communicates with an exhaust passageway 28b. Likewise, the cup 23b of the spinner type process unit (DEV) communicates with another exhaust passageway 28b. These exhaust passageways 28b are combined to form a main exhaust passageway 28a, which further communicates with the overall air discharge pipe 99. As described previously, all the waste gas generated within the clean room is collectively discharged to the outside through the discharge pipe 99.

Figure 6:
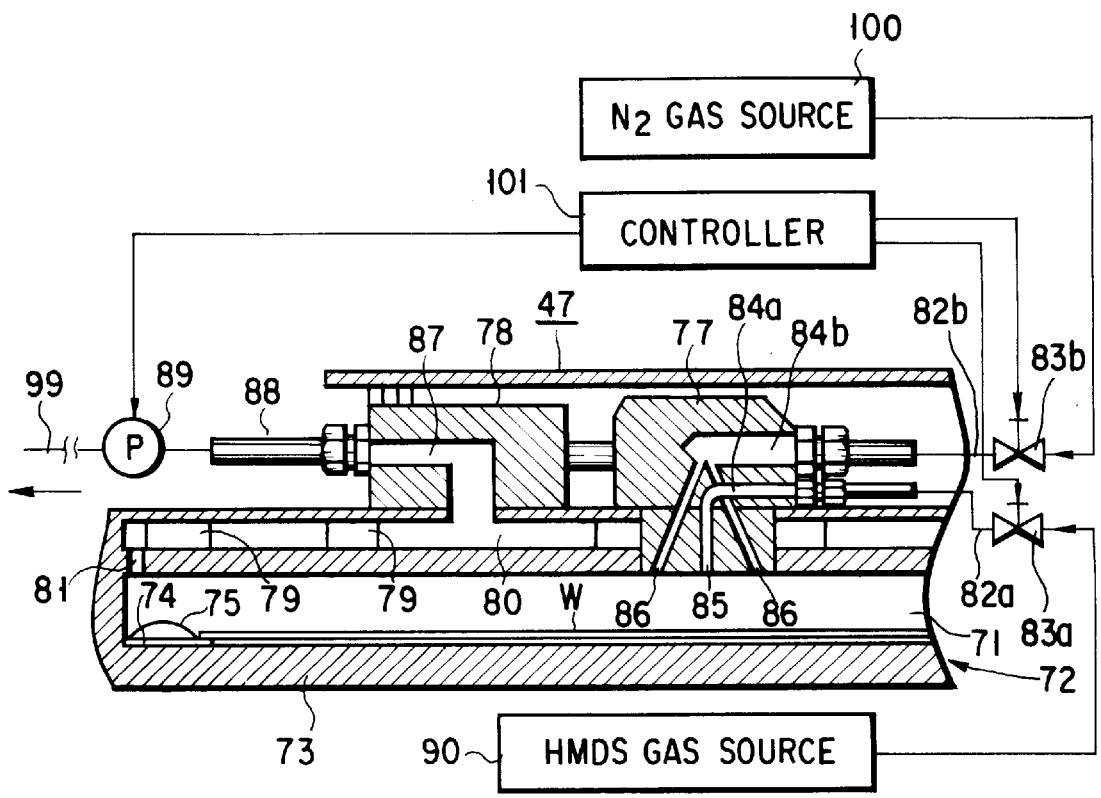
FIG. 6 is a cross sectional view schematically showing an adhesion processing unit as a substrate processing apparatus of the present invention.

The adhesion unit (AD) 47 included in the third process group G3 is shown in detail in FIGS. 6 to 9. As shown in FIG. 6, the adhesion unit 47 has a small process chamber 71 in which the wafer W to be processed is supported substantially horizontal by a substrate supporting mechanism 72. The substrate supporting mechanism 72 comprises a base plate 73, a spacer 74, and a positioning member 75. Employed in the adhesion unit 47 is a so-called "proximity process system" in which the wafer W is held such that the both surfaces of the wafer W are positioned close to the inner walls of the process chamber 71, and a gas is circulated through a narrow space defined between the wafer W and the inner wall of the process chamber 71.

Figure 7:
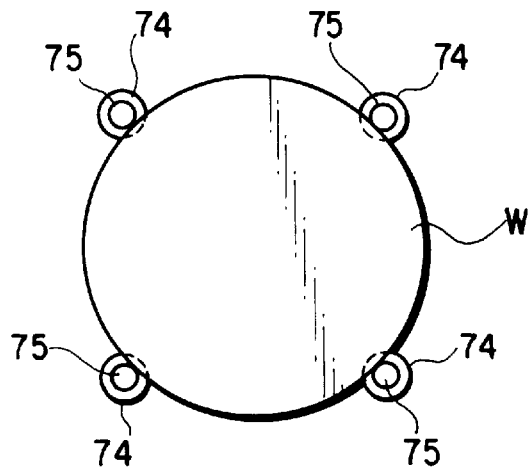
FIG. 7 is a plan view schematically showing a wafer supporting mechanism included in the adhesion processing unit.

As shown in FIG. 7, four spacers 74 are mounted on the base plate 73 and arranged along the outer periphery. Also, the positioning members 75 are mounted to the spacers 74. Each of these spacer 74 and positioning member 75 is screwed to the base plate 72. The positioning member 75 is upwardly tapered from the periphery toward the center. If the wafer W is disposed on the substrate supporting mechanism 72, the outer periphery of the wafer W is guided by the weight of the wafer W along the tapered surface of the positioning member 75, with the result that the wafer W is positioned stably, as desired. Incidentally, a heater (not shown) is embedded in the base plate 72. The power source (not shown) of the heater is connected to an output terminal of a controller 101, with the result that the heating temperature of the wafer W is controlled by the controller 101.

A plate 76 is detachably mounted in an upper portion of the process chamber 71. Also, a gas supply portion 77 and a gas discharge portion 78 are mounted above the plate 76. An inner fluid passageway 80, whose inner diameter is kept substantially constant by a plurality of spacers 79, is formed within the plate 76. Also, a hole 81 communicating with the process chamber 71 is formed through an outer peripheral portion of the bottom of the plate 76. The waste gas generated in the process chamber 71 flows through the hole 81 into the inner fluid passageway 80.

Two gas supply pipes 82a, 82b are mounted to the gas supply portion 77. The pipe 82a is connected via a flow rate control valve 83a to an HMDS gas supply source 90, with the other pipe 82b being connected via a flow rate control valve 83b to a nitrogen gas supply source 100. The operations of these flow control valves 83a, 83b are controlled by the controller 101.

First and second horizontal fluid passageways 84a, 84b communicating with the pipes 82, 82b, respectively, are formed within the gas supply portion 77. The first horizontal fluid passageway 84a communicates with a vertical fluid passageway 85 which is open right above a central portion of the base plate 73. On the other hand, the second horizontal fluid passageway 84b communicates with a plurality of radially branched fluid passageways 86 which are open at portions somewhat deviant from the center of the base plate 73. To be more specific, the HMDS gas is blown perpendicularly against the wafer W through the vertical fluid passageway 85. On the other hand, the nitrogen gas passes through the radially branched fluid passageways 86 so as to be obliquely blown against the wafer W. It is desirable for the first horizontal fluid passageway 84a to have a diameter larger than that of the second horizontal fluid passageway 84b, because it is necessary for the flow rate of the nitrogen gas (purging gas) to be higher than that of the HMDS gas.

A gas exhaust passageway 87 is formed in the gas discharge portion 78, which communicates with both an inner passageway 80 of the plate 76 and the fluid passageway of an exhaust pipe 88. An ejector (exhaust pump) 89 is mounted to the exhaust pipe 88. Also, the exhaust pipe 88 communicates with the collective discharge pipe 99. If the ejector 89 is operated by the controller 101, the gas within the process chamber 71 flows through the inner passageway 80, the gas exhaust passageway 87, the exhaust pipe 88 and the discharge pipe 99 in the order mentioned so as to be discharged to the outside.

Figure 8:
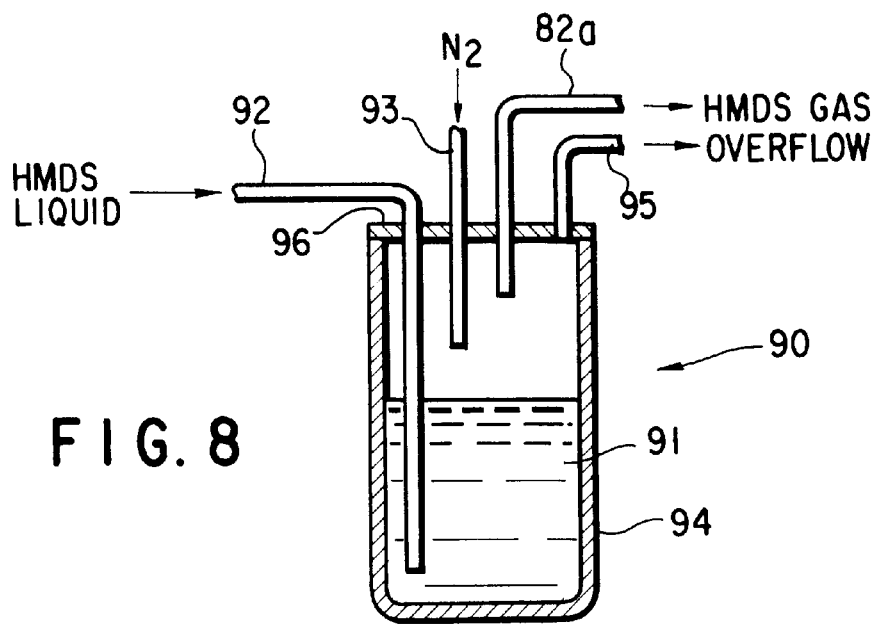
FIG. 8 schematically shows an HMDS gas generation apparatus.

FIG. 8 shows in detail the HMDS gas supply source 90. As shown in the drawing, the HMDS gas supply source 90 includes a hermetic jar 94 for storing a liquid HMDS 91. The upper open end of the jar 94 is covered with an upper lid 96. Also, an HMDS supply pipe 92 extends through the upper lid 96 such that the open end of the pipe 92 is positioned in the vicinity of the bottom of the jar 94. The supply pipe 92 communicates with an HMDS liquid supply source (not shown) so as to permit the HMDS liquid to be supplied into the jar 94. Incidentally, a heat insulating material (not shown) is wound about the jar 94.

A nitrogen gas supply pipe 93 and the HMDS gas supply pipe 82a referred to previously also inserted into the jar 94 through the upper lid 96. The open end of the nitrogen gas supply pipe 93 is positioned above the liquid surface within the jar 94. Further, the open end of the HMDS gas supply pipe 82a is positioned within the jar 94 above the open end of the nitrogen gas supply pipe 93. An overflow pipe 95 is also mounted to the upper lid 96 for releasing the overflow to the outside. If a nitrogen gas is blown through the gas supply pipe 93 against the surface of the liquid HMDS 91 within the jar 94, the liquid HMDS 91 is partly evaporated to form an HMDS gas, which is supplied through the HMDS gas supply pipe 82a to the process chamber 71. It is possible to blow a pressurized nitrogen gas or a heated nitrogen gas into the jar 94.

Figure 10:
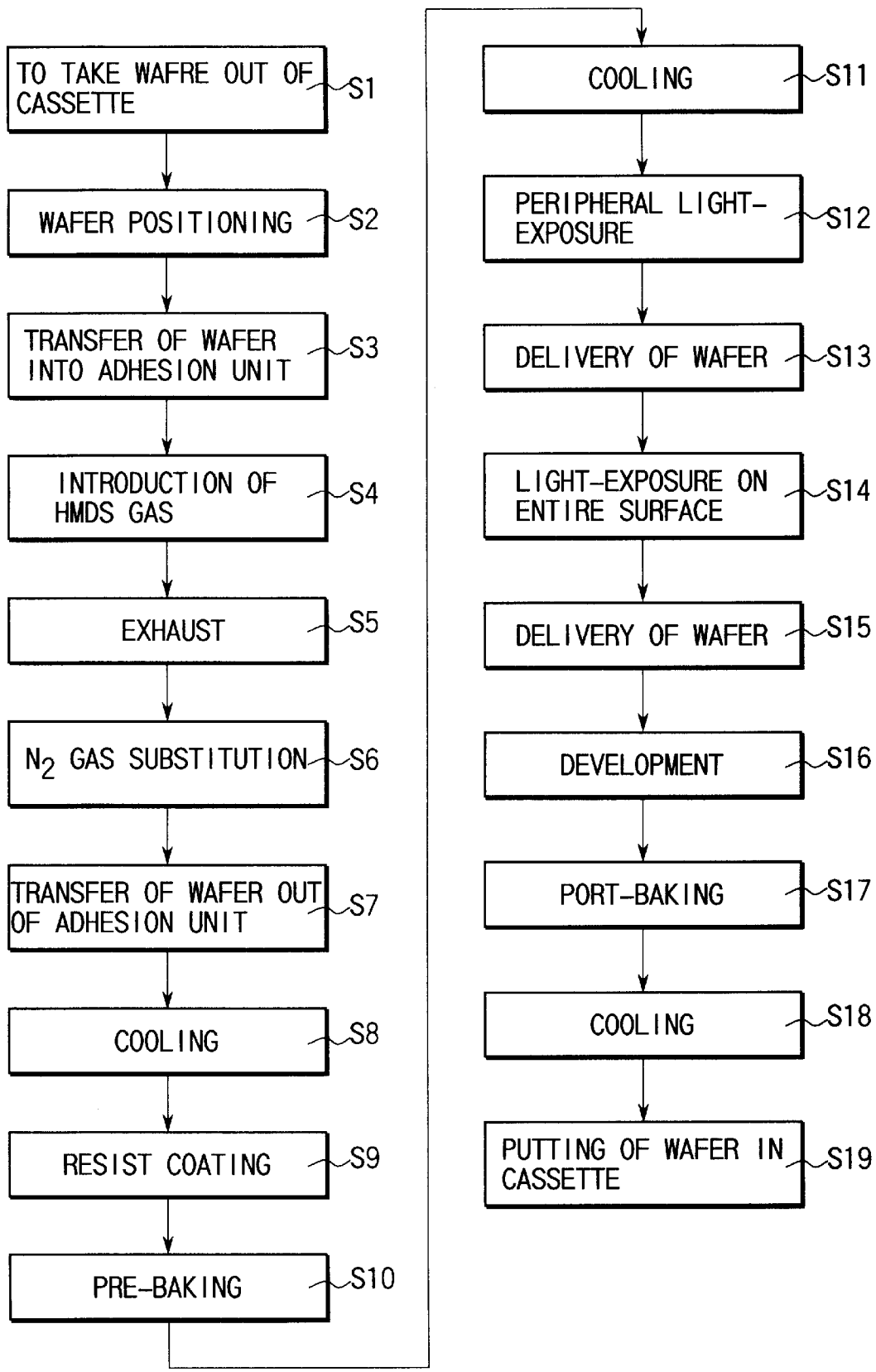
FIG. 10 is a flow chart showing a series of resist processing steps including a substrate processing method of the present invention.

FIG. 10 is a flow chart showing how to process a wafer W. In the first step, the cassette 1 housing a plurality of wafers W before processing is disposed on the cassette table 2. Then, the first sub-arm mechanism 4 obtains access to the cassette 1 and takes a single wafer W out of the cassette 1 (step S1). Further, the first sub-arm mechanism 4 obtains access from the front side to the transfer-alignment unit (TR) 46 included in the third process group G3 so as to deliver the wafer W onto the wafer table 24. In the transfer-alignment unit (TR) 46, the orientation flat of the wafer W is aligned in a desired direction, and the wafer W is centered. As a result, the wafer W is positioned as desired relative to the process station 20 and the main arm mechanism 21 (step S2). After the positioning of the wafer W, the main arm mechanism 21 obtains access from the back side to the transfer-alignment unit (TR) 46 so as to allow the holder 4a to take up the wafer W from the wafer table 24. Then, the main arm mechanism 21 transfers wafer W first into the adhesion unit (AD) 47 (step S3).

In the adhesion unit (AD) 47, the process chamber 71 having the plate 76 set therein is evacuated by the ejector 89. Then, the flow rate control valve 83a is opened so as to introduce an HMDS gas into the process chamber 71 (step S4).

Figure 9A:
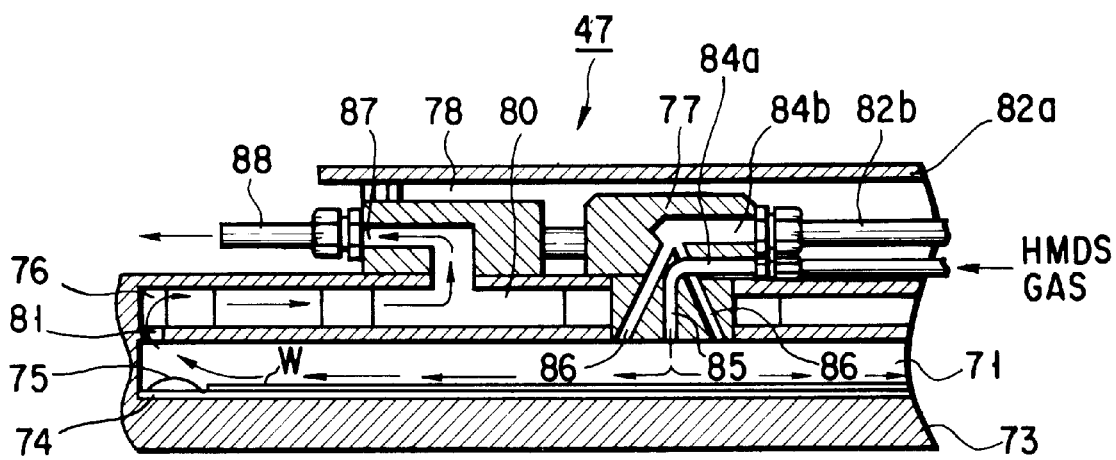
FIGS. 9A and 9B are cross sectional views collectively showing a part of the adhesion processing unit.
Figure 9B:
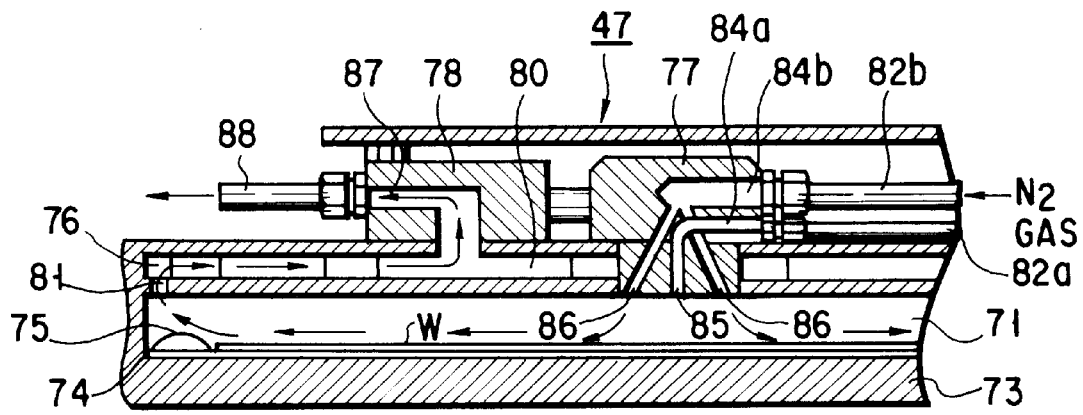

As shown in FIG. 9A, the HMDS gas is blown through the vertical fluid passageway 85 perpendicularly against the wafer W and flows radially outward along the surface of the wafer W and, then, flows upward so as to be discharged to the outside through the hole 81, the inner passageway 87, the exhaust passageway 87, the discharge pipe 88 and the collective discharge pipe 99 (step S5). Since the HMDS gas flows upward of the process chamber 71, turbulence or convection of the gas stream does not occur in the peripheral portion of the wafer W. As a result, the adhesion treatment is applied uniformly over the entire region of the wafer W. It follows that nonuniformity in the hydrophobic properties is unlikely to take place between the peripheral portion and the central portion of the wafer W. Incidentally, the HMDS gas is discharged downward of the process chamber 71 in the prior art. As a result, the gas stream is obstructed by the peripheral members such as the positioning member 75, giving rise to turbulence or convection of the gas stream in the peripheral portion of the wafer W so as to make the adhesion treatment nonuniform.

In the next step, the process chamber 71 is forcedly evacuated so as to prevent the HMDS gas from leaking into the transfer zone 22. At the same time, a nitrogen gas is introduced through the second supply pipe 82b into the process chamber 71 so as to substitute the nitrogen gas within the process chamber 71 (step S6). The nitrogen gas is blown obliquely against the wafer W through the radially branched fluid passageways 86 and, then, flows radially outward along the surface of the wafer W. Further, the nitrogen gas flows upward through the hole 81 and, then, is discharged to the outside through the inner passageway 80, the exhaust passageway 87, the exhaust pipe 88, and the collective discharge pipe 99. As a result, the HMDS gas is expelled from within the process chamber 71, and the nitrogen gas is substituted in the process chamber 71.

In order to expel the HMDS gas promptly from within the process chamber 71, it is necessary for the flow rate of the nitrogen gas to be higher than that of the HMDS gas in the adhesion step. It should be noted in this connection that, if a nitrogen gas introduced into the process chamber 71 at a high flow rate strikes perpendicularly against the wafer W, particles are likely to be generated by the impact of the striking. In the present invention, however, the nitrogen gas is blown through the radially branched fluid passageways 86 obliquely against the wafer W. As a result, the impact given by the nitrogen gas to the wafer W is diminished so as to suppress the particle generation. Incidentally, the inclining angle of the radially branched fluid passageway 86 relative to the Z-axis should desirably fall within a range of 30 to 60°.

In the present invention, the adhesion treatment is carried out within a semi-open unit 47, which is not completely hermetic, with the result that the HMDS gas tends to leak to the outside. If the leaking gas enters the process atmospheres of the other open type process units 41 to 46 and the process space 27 of the solution process type units such as the resist coating unit (COT) and the developing unit (DEV), the processing in these units tends to be adversely affected.

In the present invention, however, the adhesion unit (AD) 47 in the third process group G3 is positioned lower than the hot plate units (HP) 41 to 43, the chilling plate units (CP) 44, 45, and the transfer unit (TR) 46. In addition, a down flown of clean air is formed within the transfer zone 22. It follows that the HMDS gas leaking from the adhesion unit (AD) 47 flows downward promptly together with the down flow of the clean air so as to be released to the outside through the air discharge port 26, making it substantially impossible for the leaking gas to enter another process unit. Naturally, the HMDS gas can be prevented from adversely affecting the wafer W in another process unit.

Also, in the third process group G3, the adhesion unit (AD) 47, the transfer unit (TR) 46, the two chilling plate units (CP) 45, 44, and the three hot plate units (HP) 43, 42, 41 are stacked one upon the other in the order mentioned, as already pointed out. It follows that it is possible to avoid thermal interference among these units.

After completion of the adhesion process, the main arm mechanism 21 transfers the wafer W out of the adhesion unit 47 (step S7), followed by cooling the wafer W in any of the chilling plate units (CP) (step S8). Then, the main arm mechanism 21 transfers the wafer W into the coating unit (COT) and dispose the wafer W on the spin chuck 23a. Further, the wafer W is rotated about its own axis while evacuating the cup 23b for coating the adhesion-treated surface of the wafer W with a resist (step S9).

In the next step, the main arm mechanism 21 transfers the wafer W into any of the hot plate units (HP) for pre-baking the resist coating to a predetermined temperature range (step S10). Then, the main arm mechanism 21 transfers the wafer W into the chilling plate unit (CP) 53 included in the fourth process group G4 for cooling the wafer W (step S11). After the cooling step, the sub-arm mechanism 34 takes the wafer W out of the chilling plate unit (CP) 53 for transferring the wafer W into the peripheral light-exposure device 33 for exposing the peripheral region of the resist film to light (step S12).

Further, the sub-arm mechanism 34 takes the wafer W out of the peripheral light-exposure device 33 and transfers the wafer W into the transfer-chilling plate unit (TR-CP) 54. The wafer W is held within the transfer-chilling plate unit (TR-CP) 54 until the light-exposure device (not shown) becomes usable. When the light-exposure device becomes usable, the sub-arm mechanism 34 delivers the wafer W to an arm mechanism (not shown) of the light-exposure mechanism (not shown) (step S13). Then, the wafer W is disposed on a table (not shown) within the light-exposure device for selectively exposing the entire region of the resist film to light to form an exposing pattern (step S14).

Upon completion of the light-exposure treatment over the entire region, the sub-arm mechanism 34 receives the wafer W from the arm mechanism of the light-exposure device. Further, the wafer W is delivered to the main arm mechanism 21 via the transfer-chilling plate unit (TR-CP) 54 (step S15). Then, the main arm mechanism 21 transfers the wafer W into the developing unit (DEV) and puts the wafer W on the spin chuck 23a. Under this condition, the cup 23b is evacuated. At the same time, the wafer W is rotated about its own axis, and a developing solution is applied to the wafer W during its rotation so as to develop the light-exposed resist film (step S16).

Upon completion of the developing treatment, the main arm mechanism 21 takes the wafer W out of the developing unit (DEV) and transfers the wafer W into any of the hot plate units (HP) for post-baking the resist film to a predetermined temperature range (step S17). Further, the main arm mechanism 21 takes the wafer W out of the hot plate unit (HP) and transfers the wafer W into any of the chilling plate units (CP) for the cooling purpose (step S18). After the cooling step, the main arm mechanism 21 takes the wafer W out of the chilling plate unit (CP) and transfers the wafer W into the transfer unit (TR) 46. Then, the sub-arm mechanism 4a takes the wafer W out of the transfer unit (TR) 46 and puts the wafer W in the cassette 1 disposed on the cassette table 2 so as to finish a series of the processing of the wafer W with resist.

The present invention is not limited to the embodiments described above, and can be modified in various fashions. For example, the embodiments described above cover an adhesion process as a gas process. However, the technical idea of the present invention can also be applied to another gas process. Since the technical idea of the present invention can be applied to a gas process other than an adhesion process, the object to be processed is not limited to a semiconductor wafer. Specifically, the present invention can be applied to the processing of various substrates such as an LCD substrate, a glass substrate, a CD substrate, a photo mask, and a substrate for a printed circuit.

As described above in detail, the adhesion unit is positioned lower than the other units in the present invention, with the result that a gas processing unit does not affect other process units. Also, the present invention permits eliminating particle attachment, nonuniform processing, etc. so as to carry out a satisfactory gas processing.

Additional advantages and modifications will readily occur to those skilled in the art. Therefore, the invention in its broader aspects is not limited to the specific details and representative embodiments shown and described herein. Accordingly, various modifications may be made without departing from the spirit of scope of the general inventive concept as defined by the appended claims and their equivalents.

We claim:

1. An apparatus for processing a substrate in which a processing consisting of a plurality of process steps is applied to a substrate to be processed, comprising:

a transfer zone extending in a vertical direction;

a plurality of process groups arranged to surround said transfer zone for processing said substrate, each process group consisting of a plurality of process units stacked one upon the other, and each process unit having an opening communicating with the transfer zone for transferring the substrate into and out of said process unit;

a main arm mechanism movably mounted in the transfer zone for transferring the substrate into and out of the process unit through said opening; and down flow forming means for forming a down flow of a clean air within the transfer zone, wherein at least one of the plural process groups includes a plurality of thermal units for heating or cooling the substrate, a transfer unit for transferring the substrate into and out of the transfer zone, and a gas process unit for processing the substrate with a gas, the opening of said gas process unit being positioned lower than the openings of the thermal units and the transfer unit.

2. The apparatus according to claim 1, wherein said transfer unit is positioned lower than said plural thermal units.

3. The apparatus according to claim 2, wherein said plural thermal units include a heating unit for heating the substrate and a cooling unit for cooling the substrate, and said cooling unit is positioned lower than said heating unit.

4. The apparatus according to claim 1, wherein said down flow forming means includes an air supply means for supplying a clean air from above said transfer zone into the transfer zone and an exhaust portion having an exhaust port communicating with the transfer zone for evacuating the transfer zone, and said exhaust port is positioned lower than the opening of the gas process unit.

5. The apparatus according to claim 1, wherein a shutter is mounted in the opening of each of the process units other than the thermal unit, the transfer unit and the gas process unit for isolating the inner atmospheres of said other process units from said transfer zone.

6. The apparatus according to claim 1, wherein the opening of each of said thermal unit, the transfer unit and the gas process unit communicates directly with said transfer zone.

7. The apparatus according to claim 1, wherein said gas process unit is an adhesion unit for making the substrate surface hydrophobic using an HMDS gas.

8. An apparatus for processing a substrate in which a substrate to be processed is coated with resist, followed by subjecting a resultant resist coating to a developing treatment, comprising:

a transfer zone extending in a vertical direction;

a first process group arranged in the vicinity of said transfer zone and including a resist coating unit and a developing unit stacked one upon the other, each of said resist coating unit and said developing unit having an opening through which said substrate is transferred, and said opening communicating with said transfer zone;

a second process group arranged in the vicinity of the transfer zone and including a heating unit, a cooling unit, a transfer unit and an adhesion unit, each of said units having an opening through which the substrate is transferred, and said opening communicating with the transfer zone;

a main arm mechanism movable within the transfer zone for transferring the substrate into and out of each process unit through said opening; and down flow forming means for forming a down flow of a clean air within the transfer zone, wherein said adhesion unit, transfer unit, cooling unit, and heating unit included in said second process group are stacked in the order mentioned such that the adhesion unit occupies the lowermost position.

9. The apparatus according to claim 8, wherein said down flow forming means includes a gas inlet port formed in an upper end of the transfer zone, an exhaust port formed in a lower end of the transfer zone, and a filter mechanism mounted in said gas inlet port for cleansing the introduced air, said exhaust port being positioned lower than the opening of said adhesion unit.

10. The apparatus according to claim 8, wherein a shutter is mounted in the opening of each of said resist coating unit and the developing unit included in said first process group so as to isolate the inner atmospheres of these resist coating unit and developing unit from the transfer zone.

11. The apparatus according to claim 8, wherein the opening of each of said heating unit, cooling unit, transfer unit and adhesion unit communicates directly with the transfer zone.

12. A method for processing a substrate, comprising the steps of:

(a) transferring a substrate into a hermetic process chamber;

(b) introducing a process gas through a first fluid passageway into said process chamber to permit said process gas to be blown against a central portion of said substrate while evacuating the process chamber through an exhaust passageway to permit the introduced process gas to flow upward at a peripheral portion of the substrate, thereby to bring the process gas into contact with the entire region of a surface of the substrate for modifying said substrate surface; and (c) introducing a substituting gas through a second fluid passageway to permit said substituting gas to be blown against a region somewhat deviant from the center of the substrate while evacuating the process chamber through said exhaust passageway, thereby to expel said process gas from within the process chamber and substitute therefor said substituting gas within the process chamber.

13. The method according to claim 12, wherein said process gas is blown perpendicularly against the substrate in said step (b), and said substituting gas is blown obliquely against the substrate in said step (c).

14. The method according to claim 12, wherein said first fluid passageway has a single gas outlet port, and said second fluid passageway has a plurality of gas outlet ports.

15. The method according to claim 12, wherein said exhaust passageway includes a space formed above the process chamber.

16. An apparatus for processing a substrate, comprising:
a process chamber;
a substrate supporting mechanism for supporting a substrate substantially horizontal within said process chamber;
a first gas supply system for supplying substantially vertically a process gas onto said substrate within the process chamber;
a second gas supply system for obliquely supplying a substituting gas onto the substrate within the process chamber; and
an exhaust mechanism for evacuating the process chamber.

17. The apparatus according to claim 16, wherein said exhaust mechanism includes an exhaust port positioned above the substrate supported by said substrate supporting mechanism.

18. The apparatus according to claim 16, wherein said first gas supply system has only one discharge port, and said second gas supply system has a plurality of discharge ports.

19. An apparatus for processing a substrate, comprising:
a process chamber;
a substrate supporting mechanism for supporting a substrate substantially horizontal within said process chamber;
a first gas supply system for supplying substantially vertically a process gas onto said substrate within the process chamber;
a second gas supply system for obliquely supplying a substituting gas onto the substrate within the process chamber; and
an exhaust mechanism for evacuating the process chamber,
wherein said substrate supporting mechanism includes a base plate and a plurality of positioning members mounted to a peripheral portion of said base plate in a manner to project upward above the substrate so as to be brought into contact with a peripheral portion of the substrate and to define the position of the substrate, and
wherein said exhaust mechanism includes an exhaust port positioned above the substrate supported by the substrate supporting mechanism.

20. The apparatus according to claim 19, wherein said substrate supporting mechanism further includes a spacer for forming a free space between said base plate and the substrate.

* * * * *